US012604577B2

(12) United States Patent
Newcomb et al.

(10) Patent No.: US 12,604,577 B2
(45) Date of Patent: Apr. 14, 2026

(54) MICRO-LED ENCAPSULATED STRUCTURE INCLUDING TWO POLYMERIC LAYERS

(71) Applicant: GM GLOBAL TECHNOLOGY OPERATIONS LLC, Detroit, MI (US)

(72) Inventors: Bradley Allen Newcomb, Troy, MI (US); Thomas S. Prevost, West Bloomfield, MI (US); Julien P. Mourou, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 657 days.

(21) Appl. No.: 17/968,401

(22) Filed: Oct. 18, 2022

(65) Prior Publication Data

US 2024/0128415 A1 Apr. 18, 2024

(51) Int. Cl.
| | |
|---|---|
| *H10H 20/854* | (2025.01) |
| *H01L 25/075* | (2006.01) |
| *H10H 20/01* | (2025.01) |
| *H10H 20/857* | (2025.01) |

(52) U.S. Cl.
CPC ....... *H10H 20/854* (2025.01); *H01L 25/0753* (2013.01); *H10H 20/01* (2025.01); *H10H 20/857* (2025.01); *H10H 20/0362* (2025.01); *H10H 20/0364* (2025.01)

(58) Field of Classification Search
None
See application file for complete search history.

(56) References Cited

U.S. PATENT DOCUMENTS

| | | | | |
|---|---|---|---|---|
| 11,267,514 | B2 | 3/2022 | Aitharaju et al. | |
| 11,358,647 | B1 | 6/2022 | Newcomb et al. | |
| 11,383,771 | B1 | 7/2022 | Newcomb et al. | |
| 11,420,683 | B2 | 8/2022 | Newcomb et al. | |
| 2007/0189007 | A1* | 8/2007 | Nishimoto | H01L 24/97 |
| | | | | 257/E33.059 |
| 2007/0241478 | A1* | 10/2007 | Buckley | B29C 70/12 |
| | | | | 425/324.1 |
| 2013/0026522 | A1* | 1/2013 | Shiobara | H10H 20/854 |
| | | | | 257/E33.072 |
| 2014/0014993 | A1* | 1/2014 | Koseki | H10H 20/8506 |
| | | | | 257/98 |
| 2015/0054003 | A1* | 2/2015 | Oraw | F21K 9/00 |
| | | | | 438/27 |

(Continued)

FOREIGN PATENT DOCUMENTS

DE 112020005976 T5 10/2022

OTHER PUBLICATIONS

Lee, Ho-Jun et al. "Improved Light Output Power of Chemically Transferred InGaN/GaN Light-Emitting Diodes for Flexible Optoelectronic Application"; Hindawi Publishing Corporation; Journal of Nanomaterials; vol. 2015, Article ID 142096; 6 pages.

(Continued)

*Primary Examiner* — Feifei Yeung Lopez

(57) ABSTRACT

A micro-LED encapsulated structure comprising a plurality of micro-LEDs and interconnections arranged on a supporting layer. A first polymer layer includes a first polymer matrix encapsulating the plurality of micro-LEDs, the interconnections, and the supporting layer. A second polymer layer includes a second polymer matrix encapsulating at least one side of the first polymer layer.

20 Claims, 5 Drawing Sheets

(56) References Cited

U.S. PATENT DOCUMENTS

| | | | | |
|---|---|---|---|---|
| 2015/0245476 | A1* | 8/2015 | Akahane | H05K 1/0366 |
| | | | | 442/180 |
| 2021/0104651 | A1 | 4/2021 | Bae et al. | |
| 2021/0402719 | A1* | 12/2021 | Guha | B32B 7/09 |
| 2022/0212449 | A1 | 7/2022 | Newcomb et al. | |
| 2022/0212723 | A1 | 7/2022 | Newcomb et al. | |
| 2022/0293832 | A1* | 9/2022 | Min | H10H 20/84 |
| 2023/0411574 | A1* | 12/2023 | Hu | H01L 21/6835 |

OTHER PUBLICATIONS

U.S. Appl. No. 17/406,023, filed Aug. 18, 2021, Newcomb et al.
U.S. Appl. No. 17/406,024, filed Aug. 18, 2021, Newcomb et al.
U.S. Appl. No. 17/584,557, filed Jan. 26, 2022, Newcomb et al.
U.S. Appl. No. 17/667,260, filed Feb. 8, 2022, Newcomb et al.
U.S. Appl. No. 17/699,696, filed Mar. 21, 2022, Newcomb et al.
U.S. Appl. No. 17/825,041, filed May 26, 2022, Newcomb et al.
U.S. Appl. No. 17/845,333, filed Jun. 21, 2022, Newcomb et al.
German Office Action from counterpart DE1020231114689, dated Jan. 21, 2026.

* cited by examiner

MICRO-LED ENCAPSULATED STRUCTURE INCLUDING TWO POLYMERIC LAYERS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to encapsulated micro-LED structures, and more particularly to a micro-LED encapsulated structure including two polymeric layers.

Vehicles include structural components such as hoods, decklids, doors, fenders, liftgates and other structural components and other non-structural components such as taillight assemblies and interior trim. Some of the structural and non-structural components include simple displays or lights such as turn signals or taillight assemblies that are attached to a rear surface of the components.

SUMMARY

A micro-LED encapsulated structure comprising a plurality of micro-LEDs and interconnections arranged on a supporting layer. A first polymer layer includes a first polymer matrix encapsulating the plurality of micro-LEDs, the interconnections, and the supporting layer. A second polymer layer includes a second polymer matrix encapsulating at least one side of the first polymer layer.

In other features, the supporting layer is made of a third polymer matrix. The first polymer matrix is selected from a group consisting of a thermoset polymer, a thermoplastic polymer, an elastomer, or a vitrimer. The second polymer matrix is selected from a group consisting of a thermoset polymer, a thermoplastic polymer, an elastomer, or a vitrimer.

In other features, the third polymer matrix of the supporting layer and the first polymer matrix of the first polymer layer are the same. The supporting layer is made using a different polymer matrix than the first polymer layer. The first polymer matrix and the second polymer matrix are the same. The first polymer matrix and the second polymer matrix are different. The first polymer layer and the second polymer layer have different opacity. The first polymer layer and the second polymer layer are transparent.

In other features, at least one of reinforcing fibers and fiber tow arranged on the supporting layer. The first polymer layer encapsulates the plurality of micro-LEDs, the interconnections, the at least one of reinforcing fibers and fiber tow, and the supporting layer.

In other features, the reinforcing fibers are attached to the supporting layer. The reinforcing fibers are infused with a polymer matrix. The reinforcing fibers comprise a structural fiber and a thermoplastic fiber that are consolidated under temperature and/or pressure prior to the encapsulating with the first polymer matrix. The reinforcing fibers include a partially cured thermoset resin.

In other features, reinforcing fibers are arranged on the first polymer layer. The second polymer layer encapsulates the first polymer layer and the reinforcing fibers.

A method for manufacturing a micro-LED encapsulated structure includes providing a plurality of micro-LEDs and interconnections arranged on a supporting layer; encapsulating the plurality of micro-LEDs, the interconnections, and the supporting layer in a first polymer layer including a first polymer matrix; and encapsulating at least one side of the first polymer layer in a second polymer layer including a second polymer matrix. The first polymer matrix is one of transparent or opaque and the second polymer matrix is transparent.

In other features, the method includes arranging reinforcing fibers on the supporting layer and encapsulating the plurality of micro-LEDs, the interconnections, the reinforcing fibers, and the supporting layer in the first polymer layer.

In other features, the method includes attaching the reinforcing fibers to the supporting layer using stitches. The method includes arranging reinforcing fibers on the first polymer layer; and encapsulating the first polymer layer and the reinforcing fibers in the second polymer layer. The reinforcing fibers comprise a dry reinforcing fiber infused with a polymer.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to a composite panel including a first polymer layer including embedded micro- LEDs and a second polymer layer encapsulated over at least part of the first polymer layer. In some examples, at least one of the first polymer layer and the second polymer layer further includes reinforcing fibers in locations where the embedded micro-LEDs are not located.

Figures 1A, 1B:
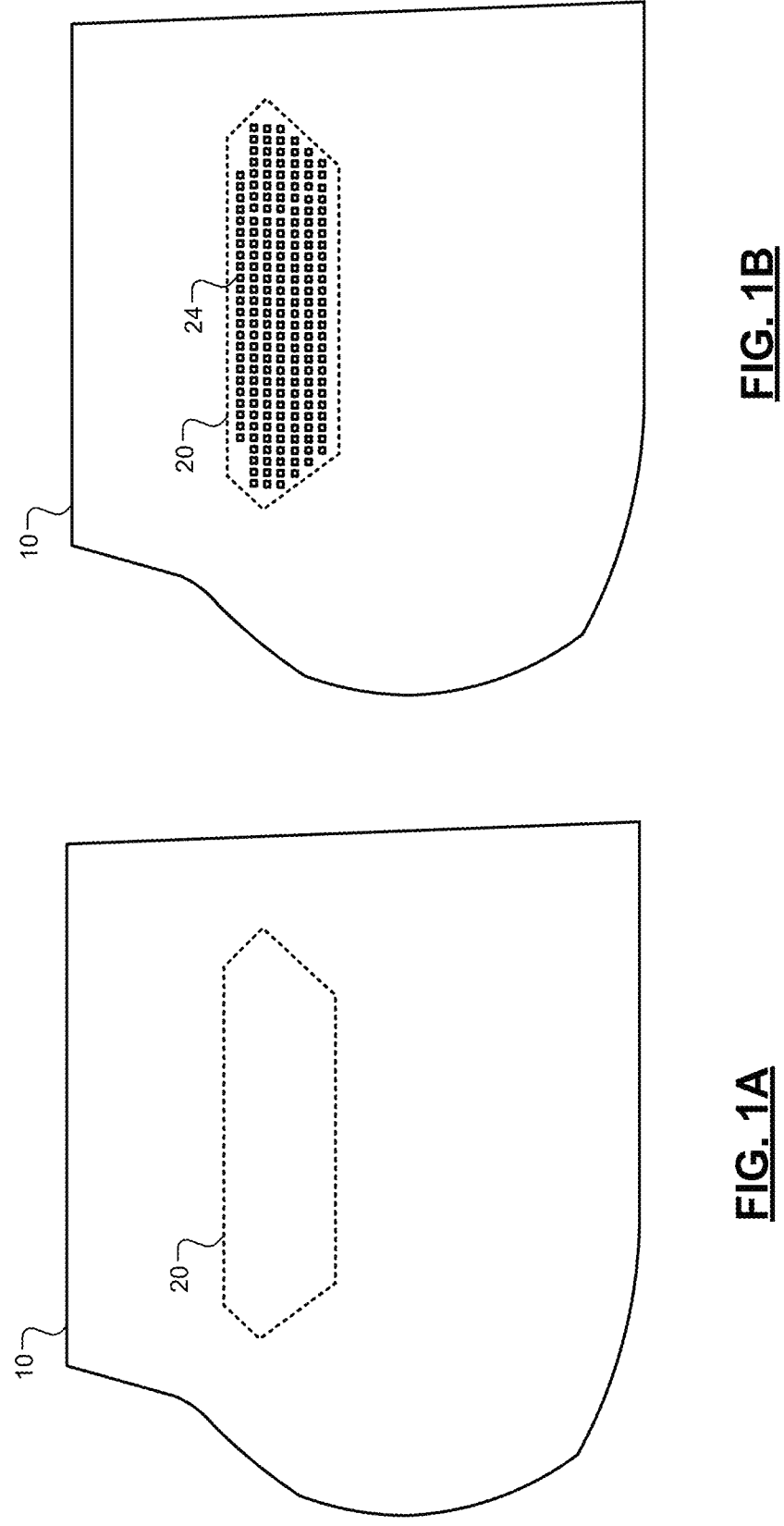
FIGS. 1A and 1B are side views illustrating a micro-LED encapsulated structure including embedded micro-LEDs according to the present disclosure.

Referring now to FIGS. 1A and 1B, a micro-LED encapsulated structure 10 including first and second polymeric layers is shown. In FIG. 1A, the micro-LED encapsulated structure 10 includes a region 20 with embedded micro-LEDs that are not illuminated. In FIG. 1B, the embedded micro-LEDs 24 in the region 20 are illuminated and can be seen. As will be described further below, the micro-LED encapsulated structure 10 includes a first polymer layer (or inner layer) (shown in FIGS. 2A, 2B, 4A and 4B) including the embedded micro-LEDs 24 and a second polymer layer (or outer layer) (FIGS. 4A and 4B) that encapsulates an outer surface of the first polymer layer.

Figure 2A:
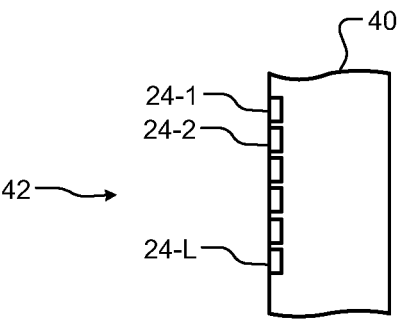
FIG. 2A is a side cross-sectional view of an example of micro-LEDs embedded in a first polymer layer on an inner side thereof according to the present disclosure.
Figure 2B:
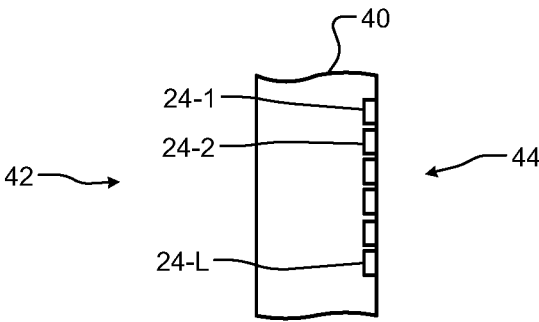
FIG. 2B is a side cross-sectional view of an example of micro-LEDs embedded in a first polymer layer on an outer side thereof according to the present disclosure.

Referring now to FIGS. 2A and 2B, the micro-LED encapsulated structure includes a first polymer layer 40 made of a first polymer matrix and including a plurality of micro-LEDs 24-1, 24-2, . . . , and 24-L, where L is an integer greater than one. In FIG. 2A, the plurality of micro-LEDs 24-1, 24-2, . . . , and 24-L are located near an inner surface 42 of the first polymer layer 40. In this example, light from the micro-LEDs 24 passes through the first polymer layer 40 to an outer surface of the first polymer layer 40. In some examples, the first polymer matrix of the first polymer layer 40 is transparent and non-diffuse.

In FIG. 2B, the plurality of micro-LEDs 24-1, 24-2, . . . , and 24-L are located near an outer surface 44 of the first polymer layer 40. In some examples, the first polymer matrix of the first polymer layer 40 is transparent and non-diffuse as in FIG. 2A. In other examples, the first polymer matrix of the first polymer layer 40 is opaque since light from the plurality of micro-LEDs 24-1, 24-2, . . . , and 24-L does not need to pass through the first polymer layer 40.

Figure 3:
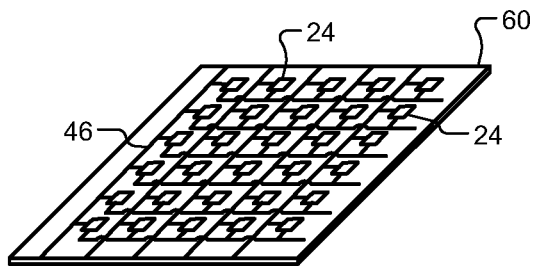
FIG. 3 is a partial perspective view of an example of micro-LEDs that are arranged on a supporting layer and include interconnects according to the present disclosure.

In FIG. 3, a portion of the micro-LED encapsulated structure 10 is shown prior to encapsulation in the first polymer layer 40. In some examples, the plurality of micro-LEDs 24 is initially manufactured on a supporting layer 60. In some examples, the supporting layer 60 is transparent. In some examples, the supporting layer 60 is made of polymer. In some examples, the supporting layer 60 is chemically and/or optically compatible with the material used for the first polymer layer 40. In other words, the supporting layer 60 is integrated with the first polymer layer 40 during encapsulation.

Examples of methods for fabricating micro-LEDs 24 on the supporting layer 60 (such as a polymer layer) are shown in Lee et al., "Improved Light Output Power Chemically Transferred InGaN/GaN Light-Emitting Diodes for Flexible Optoelectronic Applications", Journal of Nanomaterials 2015 (5) pages 1-6, which is incorporated herein by reference in its entirety.

The micro-LEDs 24 are connected by interconnects 46 (such as conductive traces and/or conductive ink) to allow power and/or ground to be supplied either individually to each micro-LED 24 and/or collectively to groups of micro-LEDs that are operated at the same time. The supporting layer 60, the plurality of micro-LEDs 24, and the interconnects 46 are over-molded (or encapsulated) in the first polymer layer 40. Additional details can be found in commonly assigned U.S. patent application Ser. No. 17/699,696, filed on Mar. 21, 2022, and entitled "TRANSPARENT STRUCTURAL COMPOSITES WITH ENCAPSULATED MICRO-LEDS", which is incorporated herein by reference in its entirety.

Figure 4A:
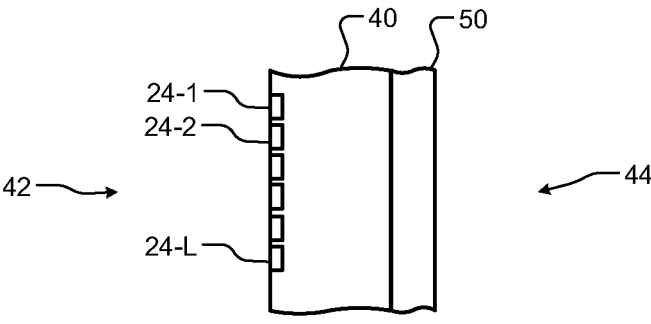
FIG. 4A is a side cross-sectional view of an example of micro-LEDs embedded in the first polymer layer on the inner side thereof and a second polymer layer located on an outer side of the first polymer layer according to the present disclosure.
Figure 4B:
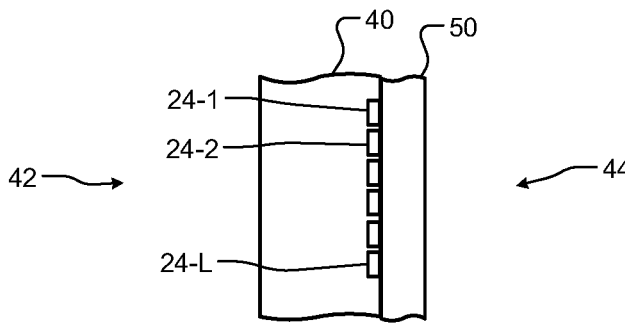
FIG. 4B is a side cross-sectional view of an example of micro-LEDs embedded in the first polymer layer on the outer side thereof and including a second polymer layer located on an outer side of the first polymer layer according to the present disclosure.

Referring now to FIGS. 4A and 4B, a second polymer layer 50 made of a second polymer matrix is arranged on the outer surface of the first polymer layer 40. In some examples, the second polymer layer 50 is over-molded over the outer surface of the first polymer layer 40. In some examples, the second polymer layer 50 is made of a polymeric material that is transparent and non-diffuse.

Figure 5:
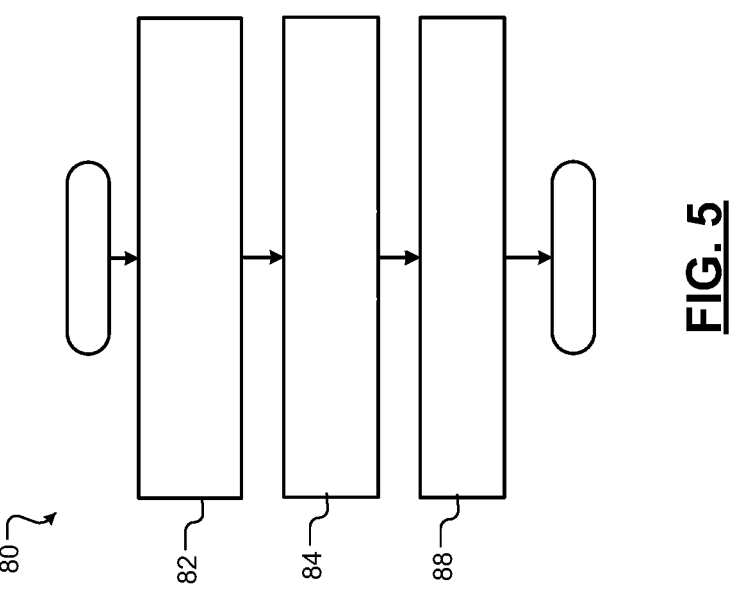
FIG. 5 is a flowchart of a method for manufacturing a micro-LED encapsulated structure including first and second polymeric layers according to the present disclosure.

Referring now to FIG. 5, a method 80 for manufacturing the micro-LED encapsulated structure 10 is shown. At 82, micro-LEDs are arranged and interconnected on a supporting layer. At 84, the micro-LEDs and interconnects are encapsulated in the first polymer layer. At 88, the outwardly facing surface of the first polymer layer 40 is over-molded with the second polymer layer.

Figure 6:
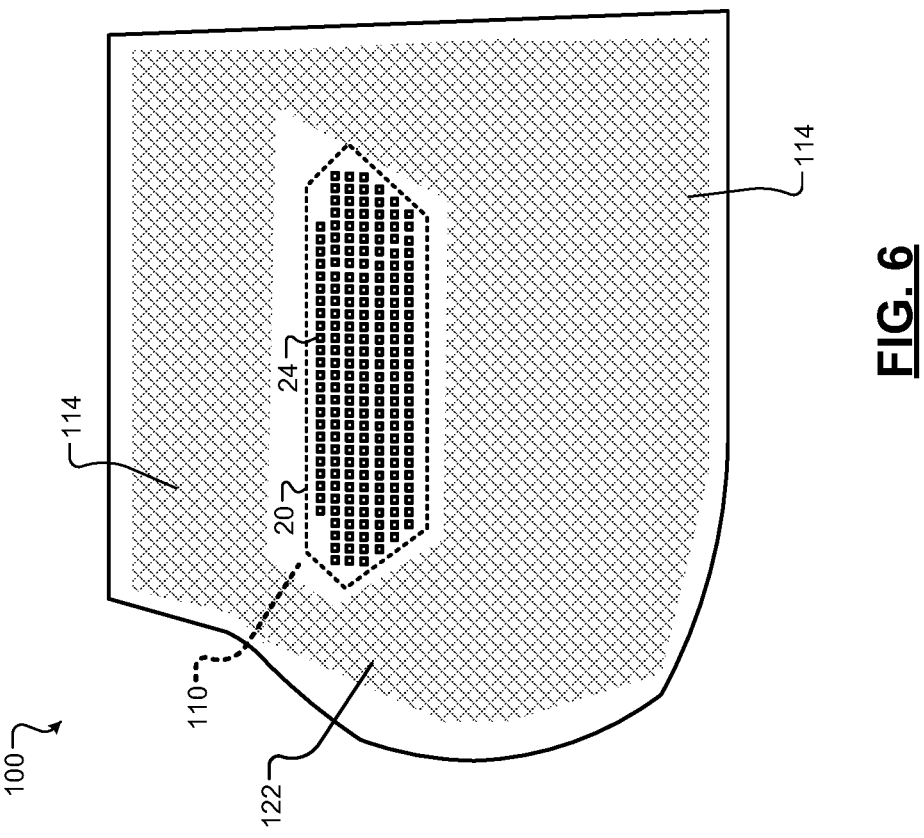
FIG. 6 is a plan view illustrating a micro-LED encapsulated structure including first and second polymeric layers and reinforcing fibers according to the present disclosure.

Referring now to FIG. 6, a micro-LED encapsulated structure 100 includes a first polymer layer 110 that encapsulates both the plurality of micro-LEDs 24 (and the interconnects 46 and the supporting layer 60) and reinforcing fibers 114. In some examples, the reinforcing fibers 114 are arranged on the supporting layer 60 in areas where the plurality of micro-LEDs 24 are not located.

In some examples, fiber tows are attached to the supporting layer 60 in a predetermined pattern using stitches. In some examples, tailored fiber placement (TFP) is used to attach the fiber tows to the supporting layer 60.

In other examples, continuous or discontinuous fibers are encapsulated. In other examples, continuous or discontinuous fibers are arranged on the supporting layer prior to encapsulation in the first polymer layer or on the first polymer layer prior to encapsulation in the second polymer layer.

In some examples, the reinforcing fibers are infused with a polymer matrix. In some examples, the reinforcing fibers comprise a structural fiber and a thermoplastic fiber that are consolidated under temperature and/or pressure prior to the encapsulating with the first or second polymer matrix. In some examples, the reinforcing fibers include a partially cured thermoset resin. In some examples, reinforcing fibers are arranged on the first polymer layer and the second polymer layer encapsulates the first polymer layer and the reinforcing fibers.

The supporting layer 60, the plurality of micro-LEDs 24 and the reinforcing fibers 114 are encapsulated in the first polymer layer 110. Then, the second polymer layer 122 is added on an outer surface of the first polymer layer 110.

In other examples, the reinforcing fibers 114 are arranged on an outer surface of the first polymer layer after the first polymer layer is created. The second polymer layer 122 encapsulates the reinforcing fibers 114 and the first polymer layer.

Figure 7:
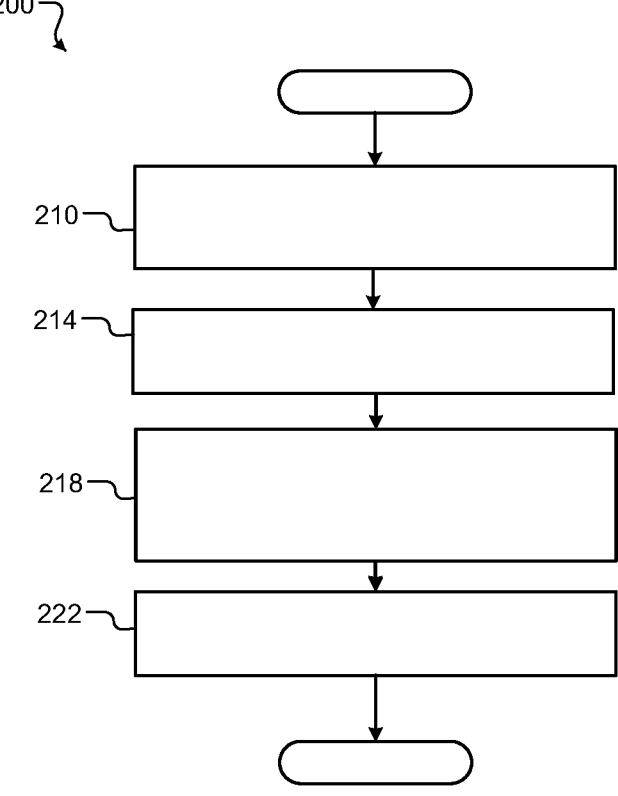
FIG. 7 is a flowchart of a method for manufacturing a micro-LED encapsulated structure including the first and second polymeric layers and the reinforcing fibers according to the present disclosure.

Referring now to FIG. 7, a method 200 for manufacturing the micro-LED encapsulated structure 100 including a first polymer layer 110 that encapsulates both the plurality of micro-LEDs 24 (and the interconnects 46 on the supporting layer 60) and the reinforcing fibers 114 is shown. At 210, the plurality of micro-LEDs 24 is arranged and interconnected on the supporting layer 60. At 214, fibers or fiber tows are arranged on one or both sides of the supporting layer. At 218, the micro-LEDs, interconnects and fibers or fiber tows are encapsulated in the first polymer layer. At 222, the outwardly facing surface is encapsulated with the second polymer layer.

In some examples, the fibers include reinforcing fibers such as carbon fiber. In other examples, the fibers include one or more fibers selected from a group consisting of glass, basalt, flax, hemp, pineapple, and cellulose. In other examples, the fibers are selected from a group consisting of carbon, glass, basalt, flax, hemp, pineapple, and cellulose. In other features, first fibers (selected from a group consisting of carbon, glass, basalt, flax, hemp, pineapple, and cellulose) are commingled with second fibers selected from a group consisting of polycarbonate, nylon, polyetheretherketone (PEEK), polyetherimide (PEI), polyphenylene sulfide (PPS), polyester, polyethylene, and polypropylene) in order to consolidate the fiber preform prior to over-molding. In some examples, the plurality of fibers has a shape selected from the group consisting of cylindrical, flat, or both cylindrical and flat.

Suitable fiber materials may include carbon fibers (e.g., carbon black, carbon nanotubes, talc, fibers derived from polyacrylonitrile and/or pitch precursors), glass fibers (e.g., fiber glass, quartz), basalt fibers, aramid fibers (e.g., KEVLAR®, polyphenylene benzobisoxazole (PBO)), polyethylene fibers (e.g., high-strength ultra-high molecular weight (UHMW) polyethylene), polypropylene fibers (e.g., high-strength polypropylene), natural fibers (e.g., cotton, flax, cellulose, spider silk), and combinations thereof, by way of example.

In some examples, the supporting layer, the first polymer layer and/or the second polymer layer includes one or more materials selected from a group consisting of polycarbonate, polypropylene, epoxy, polyurethane, polymethylmethacrylate, a polyamide, styrene-acrylonitrile, methyl methacrylate-acrylonitrile-butadiene-styrene, styrene methyl methacrylate, a glass fiber backing, polyester, and/or other transparent polymer.

The supporting layer, the first polymer layer and/or the second polymer layer may be a thermoset layer or a thermoplastic layer that is substantially transparent when free of fibers. In certain aspects, the supporting layer may be a thermoset supporting layer selected from the group consisting of: benzoxazine, a bis-maleimide (BMI), a cyanate ester, an epoxy, a phenolic (PF), a polyacrylate (acrylic), a polyimide (PI), an unsaturated polyester, a polyurethane (PUR), a vinyl ester, a siloxane, co-supporting layers thereof, and combinations thereof.

In some examples, the supporting layer includes a thermoplastic supporting layer selected from the group consisting of: polyethylenimine (PEI), polyamide-imide (PAI), polyamide (PA) (e.g., nylon 6, nylon 66, nylon 12, nylon 11, nylon 6-3-T), polyetheretherketone (PEEK), polyetherketone (PEK), polyvinyl chloride (PVC), a polyphenylene sulfide (PPS), a thermoplastic polyurethane (TPU), polypropylene (PP), polycarbonate/acrylonitrile butadiene styrene (PC/ABS), high-density polyethylene (HDPE), polyethylene terephthalate (PET), poly(methyl methacrylate) (PMMA), styrene methyl methacrylate (SMMA), methyl methacrylate acrylonitrile butadiene styrene (MABS), polycarbonate (PC), polyaryletherketone (PAEK), polyetherketoneketone (PEKK), co-supporting layers thereof, and combinations thereof.

As can be appreciated, improved interaction between the supporting layer, the first polymer layer, and the second polymer layer is achieved when the same polymeric structure or chemically compatible polymers are used.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:

1. A micro-LED encapsulated structure comprising:

a plurality of micro-LEDs and interconnections arranged on a supporting layer;

a first polymer layer including a first polymer matrix encapsulating the plurality of micro-LEDs, the interconnections, and the supporting layer, wherein the first polymer layer encapsulates a plurality of sides of each of the plurality of micro-LEDs;

reinforcing fibers are arranged on the first polymer layer; and a second polymer layer including a second polymer matrix encapsulating idea plurality of sides of the first polymer layer, wherein the second polymer layer encapsulates the first polymer layer and the reinforcing fibers.

2. The micro-LED encapsulated structure of claim 1, wherein:

the supporting layer is made of a third polymer matrix; and the third polymer matrix of the supporting layer and the first polymer matrix of the first polymer layer are the same.

3. The micro-LED encapsulated structure of claim 1, wherein:

the first polymer matrix is selected from a group consisting of a thermoset polymer, a thermoplastic polymer, an elastomer, or a vitrimer; and the second polymer matrix is selected from a group consisting of a thermoset polymer, a thermoplastic polymer, an elastomer, or a vitrimer.

4. The micro-LED encapsulated structure of claim 1, wherein:

the supporting layer is made using a different polymer matrix than the first polymer layer; and the first polymer matrix and the second polymer matrix are the same.

5. The micro-LED encapsulated structure of claim 1, wherein:

the supporting layer is made using a different polymer matrix than the first polymer layer; and the first polymer matrix and the second polymer matrix are different.

6. The micro-LED encapsulated structure of claim 1, wherein the first polymer layer and the second polymer layer have different opacity.

7. The micro-LED encapsulated structure of claim 1, wherein the first polymer layer and the second polymer layer are transparent.

8. The micro-LED encapsulated structure of claim 1, further comprising:

at least one of reinforcing fibers and fiber tow arranged on the supporting layer; and the first polymer layer encapsulates the plurality of micro-LEDs, the interconnections, the at least one of reinforcing fibers and fiber tow, and the supporting layer.

9. The micro-LED encapsulated structure of claim 8, wherein the reinforcing fibers are attached to the supporting layer.

10. The micro-LED encapsulated structure of claim 8, wherein the reinforcing fibers are infused with a polymer matrix.

11. The micro-LED encapsulated structure of claim 8, wherein the reinforcing fibers comprise a structural fiber and a thermoplastic fiber that are consolidated under temperature and/or pressure prior to the encapsulating with the first polymer matrix.

12. The micro-LED encapsulated structure of claim 8, wherein the reinforcing fibers include a partially cured thermoset resin.

13. The micro-LED encapsulated structure of claim 8, wherein the reinforcing fibers are arranged on an outer surface of the first polymer layer after the first polymer layer is formed and are not encapsulated in the first polymer layer.

14. A method for manufacturing a micro-LED encapsulated structure, comprising:

providing a plurality of micro-LEDs and interconnections arranged on a supporting layer;

encapsulating the plurality of micro-LEDs, the interconnections, and the supporting layer in a first polymer layer including a first polymer matrix, wherein the first polymer layer encapsulates a plurality of sides of each of the plurality of micro-LEDs;

applying reinforcing fibers on the first polymer layer subsequent to curing of the first polymer layer; and encapsulating a plurality of sides of the first polymer layer and the reinforcing fibers in a second polymer layer, wherein the second polymer layer includes a second polymer matrix, wherein the first polymer matrix is one of transparent or opaque and the second polymer matrix is transparent.

15. The micro-LED encapsulated structure of claim 1, wherein:

the plurality of micro-LEDs are arranged in the first polymer layer and direct light towards the second polymer layer;

the first polymer layer and the second polymer layer are transparent; and light emitted from the plurality of micro-LEDS passes through the first polymer layer and the second polymer layer.

16. The micro-LED encapsulated structure of claim 15, wherein each of the plurality of micro-LEDs comprises a first side contacting the supporting layer and other sides encapsulated in the first polymer layer.

17. The micro-LED encapsulated structure of claim 1, wherein:

the plurality of micro-LEDs are arranged in the first polymer layer and direct light towards the second polymer layer;

the first polymer layer is opaque;

the second polymer layer is transparent; and light emitted from the plurality of micro-LEDs passes through the second polymer layer.

18. The micro-LED encapsulated structure of claim 17, wherein each of the plurality of micro-LEDs comprises a first side contacting the second polymer layer and other sides encapsulated in the first polymer layer.

19. The micro-LED encapsulated structure of claim 1, further comprising the supporting layer, wherein:

the supporting layer is compatible with material of the first polymer layer; and the supporting layer is integrated with the first polymer layer during encapsulation of the supporting layer by the first polymer layer.

20. The micro-LED encapsulated structure of claim 1, wherein:

the plurality of micro-LEDs, the reinforcing fibers, and the interconnections are over-molded in the first polymer layer; and the second polymer layer is over-molded over an outer surface of the first polymer layer.

\* \* \* \* \*